US007635244B2

(12) United States Patent
Sakiya

(10) Patent No.: US 7,635,244 B2
(45) Date of Patent: Dec. 22, 2009

(54) SHEET-LIKE ELECTRONIC COMPONENT CLEAN TRANSFER DEVICE AND SHEET-LIKE ELECTRONIC COMPONENT MANUFACTURING SYSTEM

(75) Inventor: Fumio Sakiya, Kannabe-cho (JP)

(73) Assignee: Rorze Corporation, Hiroshima (JP)

( * ) Notice: Subject to any disclaimer, the term of this patent is extended or adjusted under 35 U.S.C. 154(b) by 146 days.

(21) Appl. No.: 10/516,591

(22) PCT Filed: Jun. 4, 2003

(86) PCT No.: PCT/JP03/07075

§ 371 (c)(1),
(2), (4) Date: Mar. 4, 2005

(87) PCT Pub. No.: WO03/102476

PCT Pub. Date: Dec. 11, 2003

(65) Prior Publication Data

US 2005/0191155 A1    Sep. 1, 2005

(30) Foreign Application Priority Data

Jun. 4, 2002    (JP)    ............................. 2002-163303

(51) Int. Cl.
*H01L 21/677* (2006.01)
(52) U.S. Cl. .................... 414/217; 414/744.7
(58) Field of Classification Search ................ 414/939, 414/744.5, 744.7; 545/187
See application file for complete search history.

(56) References Cited

U.S. PATENT DOCUMENTS 5,507,847 A * 4/1996 George et al. ................ 55/486
5,975,834 A * 11/1999 Ogawa et al. ............. 414/744.5
5,997,398 A * 12/1999 Yamada et al. .............. 454/187
6,007,595 A * 12/1999 Baik et al. ................. 55/385.2
6,033,301 A *  3/2000 Suwa ........................ 454/187
6,050,891 A *  4/2000 Nering ...................... 454/187
6,190,104 B1* 2/2001 Ikeda et al. ................. 414/217
6,368,393 B1* 4/2002 Hironaka .................... 96/111
6,572,468 B1* 6/2003 Sasaki et al. ................ 454/187
6,869,262 B2* 3/2005 Yamashita et al. .......... 414/217
2002/0068524 A1* 6/2002 Nakagawa .................. 454/187
2002/0108334 A1* 8/2002 Rapisarda et al. .......... 52/302.1

* cited by examiner

FOREIGN PATENT DOCUMENTS

| JP | A 9-298136 | 11/1997 |
| JP | A-11-0033950 | 2/1999 |
| JP | A-2002-147811 | 2/1999 |
| JP | A 2000-357641 | 12/2000 |
| JP | A 2001-182978 | 7/2001 |
| WO | WO 01/18323 A1 | 3/2001 |

*Primary Examiner*—Saúl J Rodríguez
*Assistant Examiner*—Joshua I Rudawitz
(74) *Attorney, Agent, or Firm*—Oliff & Berridge, PLC

(57) ABSTRACT

When a first floor (11) which is formed of a punching plate or the like and through which air passes is provided immediately below an arm (17) at a middle height part of a conveying robot (10) in a casing (2*a*) of a clean transfer device (2) and a degree of opening of a casing bottom part frame (2*b*), which supports a base part of the conveying robot (10), with respect to the outside is restricted, a class 1 can be maintained. Here, when a second floor (13) formed of a punching plate or the like is used on the casing bottom part frame (2*b*), a class 0 state can be realized under specific conditions, thereby enabling production of a semiconductor having a wire width of 0.1 μm. As a result, the device can cope with the unexpectedly high degree of cleanliness of 0.1 μm particle class 1, which cannot be realized in the prior art, requested also for the transfer device according to a reduction in wire width on a highly integrated semiconductor wafer.

11 Claims, 3 Drawing Sheets

SHEET-LIKE ELECTRONIC COMPONENT CLEAN TRANSFER DEVICE AND SHEET-LIKE ELECTRONIC COMPONENT MANUFACTURING SYSTEM

TECHNICAL FIELD

The present invention relates to a transfer device including a clean booth, which transfers a product such as a semiconductor wafer, a liquid crystal display unit, a plasma display unit, organic and inorganic electroluminescences, a field emitting display unit, a printed wiring board and others and a sheet-like electronic component used in such a product between a cassette as a cleaning vessel and various kinds of processing devices under a clean environment, and to a sheet-like electronic component manufacturing facility which uses this transfer device.

BACKGROUND ART

In a conventional clean booth as a cleaning space, as disclosed in, e.g., Japanese Patent Application Laid-open No. 1990-4145, there has been adopted a method by which clean air supplied from an HEPA (High Efficiency Particulate Air) filter or a ULPA (Ultra Low Penetration Air) filter set on a ceiling of a box-like body blows down foreign particles and these foreign particles are discharged to the outside from a grating floor formed of a perforated plate. In recent years, however, in a manufacturing process for a sheet-like electronic component as typified by a semiconductor wafer with a wire width of 1 μm or below from which contamination due to grained foreign particles or organic matters must be completely eliminated, a highly cleansed clean booth called a mini-environment has been used. As an example of this type of booth, in Japanese Patent Application Laid-open No. 2001-244315, although an apparatus which computer-controls a displacement volume by providing an exhaust system to a body of a conveying robot as a foreign particle generation source is proposed, but its quantitative effect is not described.

When a robot which may possibly generate dust is not used, although a class 10 or a lower class is achieved with respect to dust of 0.3 μm in an apparatus disclosed in, e.g., Japanese Patent Application Laid-open No. 2000-161735, this value is not sufficient when processing a semiconductor wafer whose wire width is not more than 0.5 μm. Further, in the apparatus disclosed in Japanese Patent Application Laid-open No. 2001-244315, there is a case in which a robot or an opening/closing door as a foreign particle generation source moves in a clean booth or a case in which foreign particles soar above with eddy currents generated on the rear side of a sheet-like matter, a cleanness is insufficient, and installation of an expensive computer-controlled system increases a facility cost, which is not desirable.

DISCLOSURE OF THE INVENTION

As a result of dedicated examinations for solving the above-described problems, the present inventor has found out that a very high clean state of the class 1 can be maintained with respect to particles of 0.1 μm even in the operation by using a filter which removes 99.999% or more of particles of 0.1 μm or above in a fan/filter unit, horizontally providing a floor (which will be referred to as a "first floor" hereinafter) which is positioned below an arm at a middle height part of a conveying robot and through which air flows, partitioning a first chamber between the fan/filter unit and the first floor and partitioning a second chamber between a bottom part of the casing through which air can flow to the outside and the first floor by the casing in an apparatus which automatically transfers by a conveying robot in the casing a sheet-like electronic component between predetermined positions, e.g., a cassette, a hard lock chamber such as a processing chamber and the like in clean air which has passed through the fan/filter unit provided on the ceiling of the casing.

As the fan/filter unit in the present invention, it is possible to use a device comprising a ULPA filter which can remove 99.999% or more of grained foreign particles of 0.1 μm or above, or preferably, 0.01 μm or above or remove 99.9999% of foreign particles of 0.1 μm or above and a blower which blows air into the ULPA filter. This filter may be a chemical filter on which an absorbent such as activated carbon or an activated carbon fiber filter is provided in order to absorb and remove airborne organic matters. Furthermore, a member which is positioned directly below the ULPA filter, formed of a plate-like material through which air passes and serves as a ceiling of a first chamber may be provided to the fan/filter unit in the present invention. As this ceiling member, there is a perforated plate which is formed of a metal or plastic and called a grating or a punching plate, or a grating-like material called a louver.

The present inventor has found out that a further advantage can be obtained by horizontally arranging a second floor which is positioned in the vicinity of a base of the conveying robot and through which air passes as well as the first floor and changing a degree of opening of the bottom part of the casing with respect to the outside, and thereby developed the transfer device in which a space where a sheet-like electronic component such as a wafer is transferred is very cleaned.

In the clean transfer device according to the present invention, although a door through which a sheet-like electronic component is taken in or out is provided on a wall of a clean space (a first chamber) partitioned on the upper side of the first floor where the casing receives blowing of clean air from the fan/filter unit, a gap in which each side has a width which is not less than 1 mm and not more than 30 mm is preferably provided between a door frame provided on the wall and an outer side of the closed door in the present invention. Likewise, preferably, a gap in which all of four sides have a width which is not less than 1 mm and not more than 30 mm is provided between an outer periphery of the set cassette and the door frame provided on the wall after the door is opened. Moreover, preferably, the gap having the width which is not less than 1 mm and not more than 30 mm is maintained even during movement of the cassette toward the door frame for the purpose of installation in the vicinity of the door frame or when the door is opened or closed. Moreover, preferably, the gap having the width which is not less than 1 mm and not more than 30 mm is provided between the body of a robot that is placed in the clean transfer device and the first floor.

It is to be noted that the clean transfer device according to the present invention is generally connected with a processing chamber air-tightly with respect to the outside, but it may be connected with the processing chamber with a gap having a width which is not less than 1 mm and not more than 30 mm therebetween like the cassette.

This gap can suppress a fluctuation in air pressure in a space where a sheet-like electronic component exists to the minimum level, and prevent foreign particles from being suspended with a minimum disturbance of an air current. When the gap is not provided, an exhaust air stream depends on only a degree of opening of the first floor through which air passes. Therefore, an internal pressure of the first chamber reaches up to 25 Pa, and it is reduced to $1/1.3$ to $1/2$ all at once when the door is opened. Not only a disturbance in an air current is generated due to sudden exhaust around the door, but also an eddy current may be generated in some cases due to a disturbance in the air current even around an arm of the conveying robot or a wafer in the chamber, and there occurs an inconvenience that foreign particles are involved in this eddy current or foreign particles in the eddy current cannot be discharged, for example. If the gap is as narrow as 1 mm or below, such a large internal pressure difference as described above cannot be eliminated. On the contrary, if the gap is too large, foreign particles are apt to be diffused or enter from the outside. The present inventor has discovered from an experiment and an experience that a limit of the gap is 30 mm on the maximum level.

Additionally, when an air pressure in the first chamber on the upper side of the first floor in the casing is set higher than that of the second chamber on the lower side of the first floor in the casing and air pressures in the both chambers are set to be higher than that of the outside of the casing, a stable cleanliness can be maintained in the first chamber. Here, it is preferable for the second chamber to maintain at least 0.1 Pa from the outside of the casing.

In regard to an air quantity of clean air from the fan/filter unit, it is preferable that the number of times of ventilation in the first chamber in the casing is not less than 5 and not more than 45 per minute. If the number of times of ventilation is less than 5 per minute, foreign particles flow backwards into the casing, and the cleanliness cannot be maintained. If the number of times of ventilation is approximately 20 per minute, the cleanliness can be sufficiently maintained even when the conveying robot provided inside is operating. However, it is preferable that the number of times of ventilation is up to 45 in order to cope with an emergency case such as an accident that a wafer carry-in-and-out door is opened and stopped in this state. If the number of times of ventilation exceeds 45, a flow velocity of an air current in the first chamber becomes too high, an eddy current is generated below the arm of the conveying robot, and air is stored while involving foreign particles, which is not preferable.

In order to realize the number of times of ventilation falling in the above-described range, a clean air blowing speed of the fan/filter unit is controlled. If a wind speed is less than 0.1 m/second, 5/minute as the number of times of ventilation cannot be achieved due to insufficiency of an air quantity, external foreign particles are diffused and enter from the gap around the door which is a characteristic of the present invention, and the number of particles becomes extremely high, which is fatal for the clean transfer device. On the contrary, when the wind speed is too high, static electricity is generated, and semiconductor circuit is disconnected or a transistor circuit on a liquid crystal glass substrate is damaged, which is not preferable. Further a high blow pressure is required for a high wind speed, and there is a possibility that foreign particles in the filter stored by filtering air are thrusted out by this pressure and the first chamber as a clean space is contaminated. The ULPA filter used in the present invention has the above-described possibility when a wind speed exceeds 0.65 m/second, and this value is an upper limit.

Next, in the transfer device according to the present invention, it is preferable to move up and down the door and cover a door passage provided on the second chamber side on the lower side of the first floor with a partition in order to realize movement of the door. Then, clean air which flows into the second chamber from the first chamber is directly discharged to the outside of the casing through the passage, thereby preventing the door from being contaminated. Furthermore, as to the door, a lid on the front part of a cassette for a wafer such as an FOUP (Front Opening Unified Pod) may be sucked and fixed to the door, and it may be moved up and down together with the door.

Here, a device comprising the door, the door passage, and a base which moves the cassette in a front-and-back direction with respect to the door is referred to as a load port, and one or two load ports may be incorporated in a wall of the transfer device according to the present invention.

Moreover, when the first floor is provided and the number of times of ventilation in the first chamber is maintained as 10 or above and 45 or less per minute, the high cleanliness in the first chamber can be kept and one load port can be removed when replacing the load port because of, e.g., a failure. When one load port is removed, an opening of approximately 10% to 20% in the entire area of one wall of the casing is formed. As to the first chamber, an opening of one wall of the casing mentioned above which corresponds to approximately 10% to 20% of a wall area of the first chamber is formed. The present inventor has discovered that foreign particles of 0.1 μm can be maintained at the rate of one/cubic foot if a differential pressure between an air pressure in the first chamber and an air pressure of the outside is not less than 0.1 Pa.

Additionally, the present invention also provides a sheet-like electronic component manufacturing facility which utilizes the above-described transfer device which prevents infiltration of foreign particles and contamination due to organic matters. In this facility, a cassette station for a cassette which accommodates and conveys a sheet-like electronic component is coupled with a processing chamber in which various kinds of processing such as resist coating, pre-baking, exposure, development, post-baking, etching, cleansing and others are performed with the transfer device being interposed.

The floor enabling air to pass therethrough in the present invention means a floor formed of, e.g., a perforated stainless plate, a perforated plastic plate, a grating type material having a plurality of rectangular or strip-like holes formed thereto. It is preferable that a degree of opening of the first floor is not less than approximately 5% and not more than approximately 50% of a floor area of the casing. If this degree is less than 5%, opportunities to discharge foreign particles generated in the clean chamber to the outside of the chamber is few, which is not preferable. Additionally, if this degree exceeds 50%, foreign particles are apt to be involved from the outside of the chamber, which is not preferable.

It is preferable that the degree of opening of the casing bottom part is larger than the degree of opening of the first floor. As a result, an air pressure in the first chamber is maintained higher than an air pressure in the second chamber, thereby maintaining the high degree of cleanliness. That is, the degree of opening of the casing bottom part with respect to the outside is adjusted in a range of 5% or above to 70% or below of the floor area of the casing by providing the second floor, for example.

In order to maintain the stable clean environment, it is further preferable that the degree of opening of the first floor falls within a range of 5% or above to 30% or below and the degree of opening of the casing bottom part falls within a range of 10% or above to 60% or below.

The casing in the present invention is a member which is important to partition the inside from the outside and keep it clean, and the casing is manufactured by using a material such as a stainless material, an aluminum material, an antistatic type plastic material or the like. In this casing are partitioned a first chamber into which a sheet-like electronic component such as a wafer is conveyed by an arm of a conveying robot and a second chamber in which a body lower part of the conveying robot, a control device and other devices are accommodated. It is to be noted that these devices may be distributed and arranged on the casing bottom part without providing the second floor formed of, e.g., a grating plate, and a degree of opening of the casing bottom part with respect to the outside may be thereby not less than 5% and not more than 70%.

The conveying robot in the present invention is a machine which mounts or sucks a sheet-like electronic component such as a wafer on its fingers in order to convey this component and transfers it from the cassette to various kinds of processing chambers. The conveying robot is, e.g., a scalar type robot having one arm or two arms, an articulated robot or the like, and it is a conveyer meeting clean room specifications. In an articulated part of an arm of this conveying robot, a magnetic fluid seal which stops a magnetic fluid by a magnet ring is provided in a cover gap in the vicinity of a bearing, thereby interrupting generation of dust from a belt, a pulley or a gear in the arm to the outside of the arm. Further, when a body of this conveying robot performs the up-and-down motion (which will be referred to as a "Z axis movement" hereinafter) in order to move up and down the arm of this conveying robot, air in the body moves in and out. In this example, it is preferable to adopt a structure in which the air is sucked and exhausted from an opening part as a vent hole provided on a robot bottom part, or a body cover which covers the body is disposed on a side surface of the body, a gap is formed on the inner side of the body cover and a base cover which covers a robot base is attached so that air is upwardly taken in and downwardly exhausted from the downward cover gap as a vent hole on the side surface lower part of the robot. When such a structure is adopted, air containing foreign particles in the body of the robot can be downwardly discharged from the lower part of the robot without providing an exhaust fan to the robot lower part. Incidentally, it is preferable that the main body (the body) of the conveying robot rotates without moving in the right and left directions (which will be referred to as an "X axis movement" hereinafter) in order to suppress the degree of opening of the first floor to some extent.

BEST MODE FOR CARRYING OUT THE INVENTION

Figure 1:
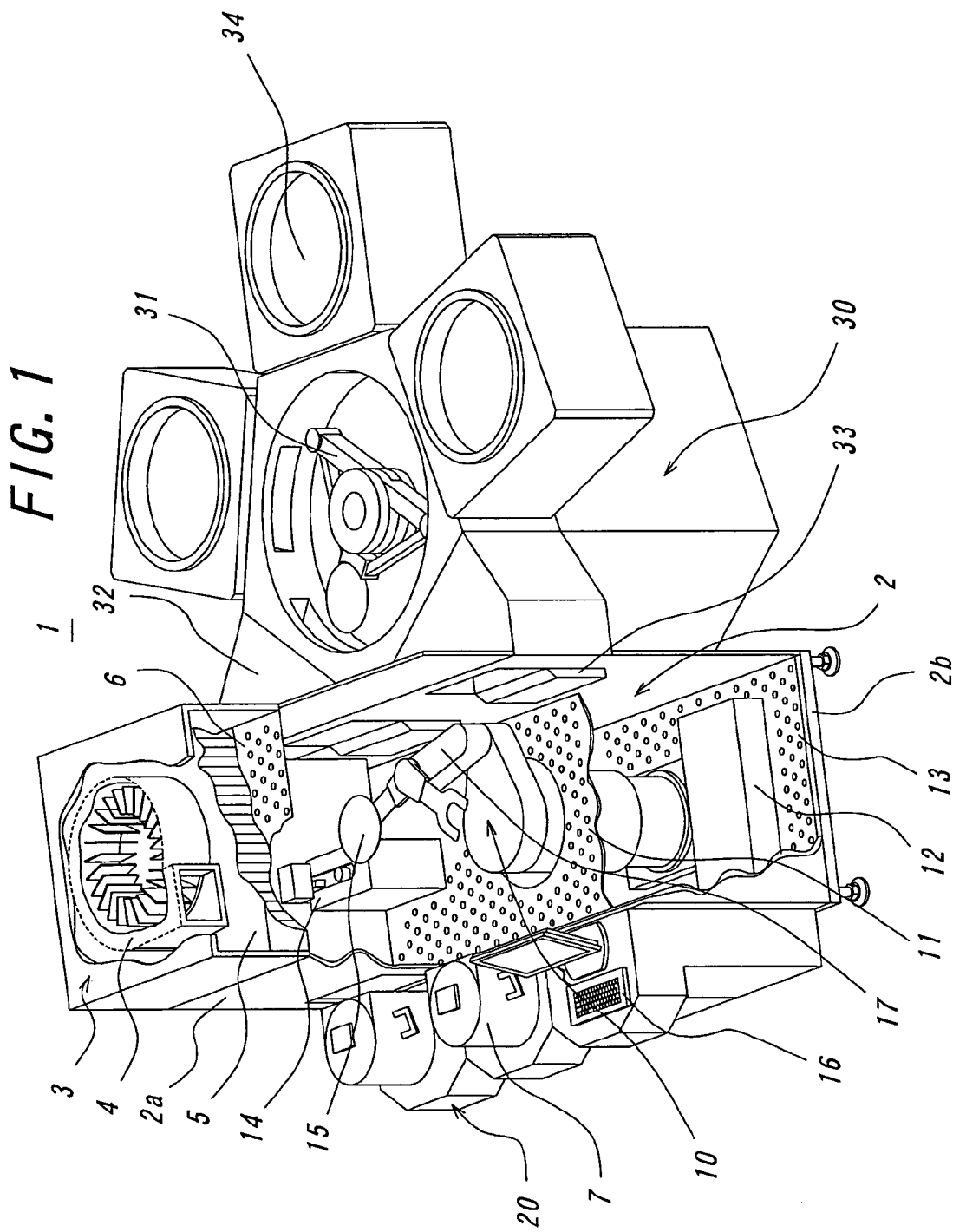
FIG. 1 is a partially cutaway perspective view showing a sheet-like electronic component manufacturing facility comprising a sheet-like electronic component clean transfer device according to an embodiment of the present invention.

FIG. 1 is a partially cutaway perspective view showing a sheet-like electronic component manufacturing facility comprising a clean transfer device as an embodiment according to the present invention. Reference numeral 1 in the drawing denotes a sheet-like electronic component manufacturing facility, and reference numeral 2 designates a clean transfer device as an embodiment according to the present invention. The clean transfer device 2 of this embodiment comprises: a fan/filter unit 3 including a blower 4 composed of a sirocco fan, a ULPA fitter (e.g., a Daikin neuro-fine (a boron-free type) LMH6051050 type) 5 and a clean air outlet 6 on a ceiling of a casing 2a; a load port 20 having a cassette 7 accommodating a semiconductor wafer mounted therein on one wall of the casing 2a; and a door 33 of a load lock chamber 32 on a wall on the opposite side. Other walls are all air-tight with respect to the outside. Moreover, the casing 2a comprises therein: a conveying robot 10 as a scalar type robot having a single arm which conveys a wafer 15; a first floor 11 positioned directly below an arm 17 of the conveying robot 10; and a second floor 13 positioned at the lower part of the casing 2a and above a bottom part frame 2b of the casing 2a. A punching metal plate formed of stainless steel is used for the clean air outlet 6, the first floor 11 and the second floor 13 in this example, and a wall material and columns of the casing 2a are formed of aluminum.

Additionally, the clean transfer device 2 in this embodiment comprises a wafer positioning device 14 and a robot control device 12 inside the casing 2a, and comprises an input/output device 16 for control data outside the casing 2a. The conveying robot 10, the wafer positioning device 14 and the robot control device 12 are set on a bottom part frame 2b having an opening part through which air can pass to the outside in the casing 2a. Further, this clean transfer device 2 is connected with a semiconductor processing device 30 air-tightly with respect to the outside through the door 33 of the load lock chamber 32, and a wafer is conveyed between the load lock chamber 32 and the chamber 34 for various kinds of processing by a processing device conveyer 31 in this semiconductor processing device 30.

Figure 2:
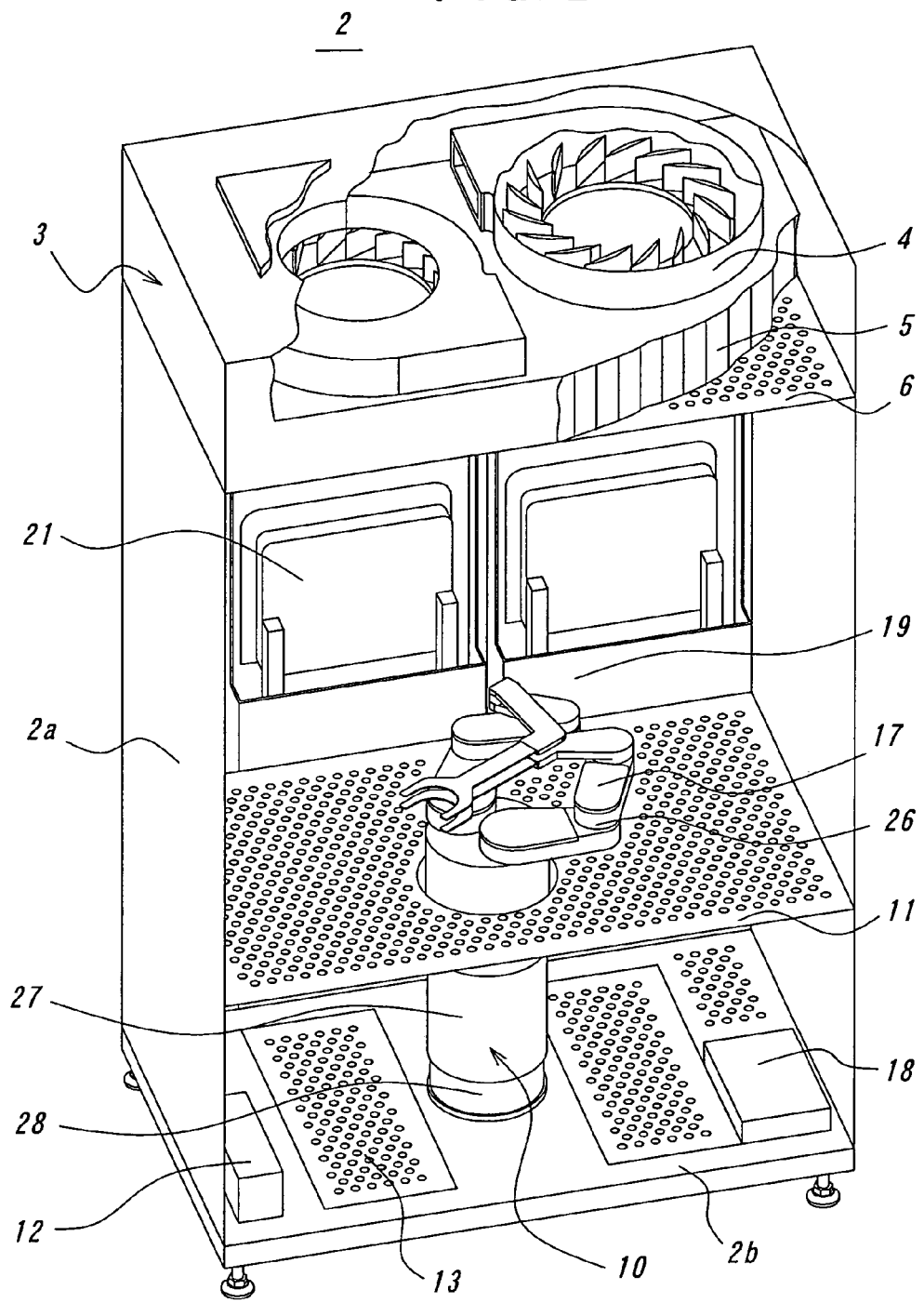
FIG. 2 is a partially cutaway perspective view showing a sheet-like electronic component clean transfer device according to another embodiment of the present invention.

FIG. 2 is a partially cutaway perspective view showing a clean transfer device as another embodiment according to the present invention. The clean transfer device 2 according to this embodiment comprises a fan/filter unit 3 which is the same as the foregoing embodiment on a ceiling of a casing 2a, two doors 21 for a cassette 7 are provided and slide in a vertical direction, their slid passages are partitioned from any other part of a second chamber by respective partitions 19, and a first floor 11 is made of a stainless steel punching plate horizontally positioned directly below an arm 17 at a middle height part of a conveying robot 10. The conveying robot 10 is a so-called double-armed scalar type robot and set on a bottom part frame 2b through which air can pass to the outside in the casing 2a together with a power supply device 18 and a control device 12. A second floor 13 is formed of a plurality of strip-like punching plates and fixed on the bottom part frame 2b so as to be detached according to needs.

Figure 3:
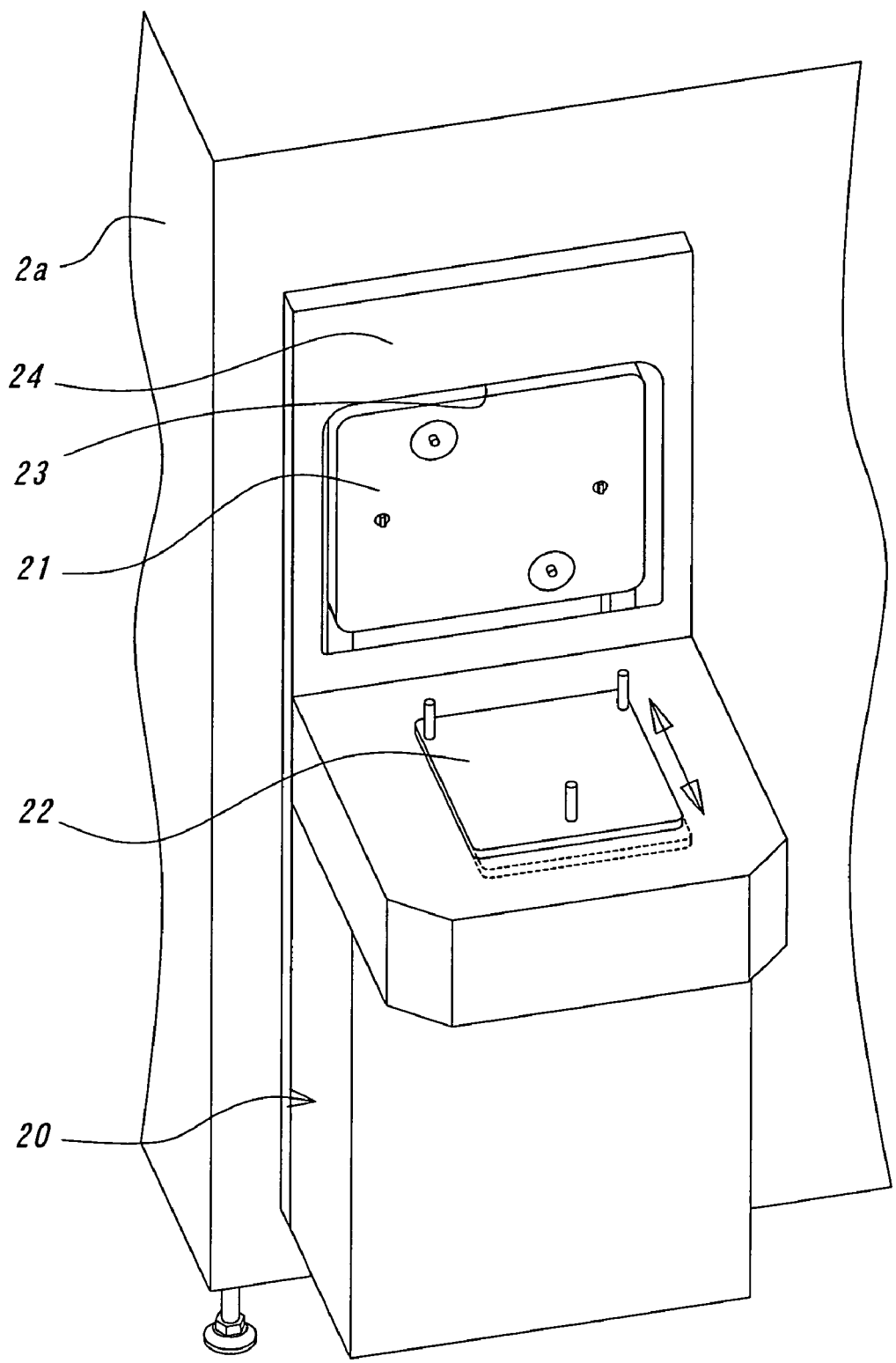
FIG. 3 is a perspective view showing a load port on which a cassette is mounted in the clean transfer device depicted in FIG. 2.

FIG. 3 is a view of a load port 20 having the door 21 depicted in FIG. 2 as seen from the outside of the transfer device 2. A gap L is provided between a door frame 23 provided in a wall 24 and the door 21, and a size (a width) of the gap L is set to 2 mm in this embodiment so that clean air can flow to the outside from the inside of the casing 2a of the transfer device 2. It is to be noted that a gap is likewise provided between the first floor 11 and the body of the conveying robot 10 in FIG. 2, and a size (a width) of this gap is 5 mm. The door 21 vertically moves down from a position shown in FIG. 3 to the lower side and opens on the side beyond the wall 24, i.e., the inner side of the casing 2a of the transfer device 2. The cassette accommodating a wafer therein is mounted on a stage 22 and moves in a front-and-back direction in accordance with opening/closing of the door 21, and a size (a width) of a gap between a front end outer rim of the moving cassette and the door frame 23 is suppressed to 25 mm on the maximum level.

It is to be noted that a magnetic fluid seal which stops a magnetic fluid by a magnet ring is provided in a cover gap in the vicinity of a bearing of an arm articulated part 26 of the conveying robot 10 in this example so that generation of dust from a belt, a pulley or a gear in the arm to the outside of the arm is interrupted. Furthermore, when the body of this conveying robot 10 performs the Z axis movement in the vertical direction in order to move up and down the arm 17 of this conveying robot 10, air in the body is taken in and out. However, in this example, a body cover 27 which covers the body is disposed on a side surface of the body, a gap is formed on the inner side of the body cover 27, and a base cover 28 which covers a robot base is attached so that air can be upwardly taken in and downwardly exhausted from the downward cover gap as a vent hole at the side surface lower part of the robot.

EMBODIMENTS

Embodiments according to the present invention will now be described hereinafter.

[Experimental Device]

A cleanliness measurement experiment was conducted by using the clean transfer device (RACS300-2A type manufactured by Rorze) 2 shown in FIG. 2. The fan/filter unit 3 provided to the ceiling part has two sirocco fans 4 mounted in parallel with each other, the ULPA filter 5 has a performance which removes 99.9999% of silica particles of 0.1 μm, an air outlet part connected to the first chamber has an area of 590 mm×1080 mm on a substantially entire area of the ceiling 6 formed of a punching metal plate having many holes with a diameter of 5 mm formed thereto, and a maximum wind speed is 0.65 m/second at a position which is 200 mm below the air outlet part. A capacity of the first chamber is a side 1150 mm×a depth 685 mm×a height 940 mm, and a capacity of the second chamber is a side 1150 mm×a depth 685 mm×a height 605 mm. A scalar type conveying robot (RR713 type manufactured by Rorze) 10 having a body diameter of 260 mm is installed on a bottom part frame 2b at the center of bottom part of the second chamber 2 so as to pierce the first floor 11. The first floor 11 is formed of a punching metal plate having many holes having a diameter of 4 mm formed thereto, and a gap whose width is 0.5 mm is formed around the conveying robot 10 so that the conveying robot 10 can perform the up-and-down and rotational movements.

Two load ports 20 which are used to place a 300 mm wafer accommodation cassette (which will be referred to as an "FOUP" hereinafter) are set on one wall surface in the lateral direction, and a port door of each load port 20 is determined as a door 21 on the wall surface. A door area is 360 mm×335 mm, and a gap whose width is 6 mm when the door is closed is provided around the door. When the door 21 is opened and the FOUP advances a distance corresponding to a wall thickness, a gap having a maximum width of 20 mm is temporarily formed. However, when the FOUP stops, the gap between the FOUP and the door frame 23 is reduced to a width of 6 mm. Any other surrounding wall surface is sealed.

The bottom part frame 2b has a maximum degree of opening being 53% when devices such as a robot base, a control device and others are installed and the second floor 13 formed of a punching metal plate is not used, and the degree of opening of the bottom part frame 2b was changed by aligning punching metal plates at a part of the bottom part frame 2b which is opened to the outside. Furthermore, in this experiment, the degrees of opening of the first floor 11 and the second floor 13 were changed by attaching a plastic tape having a board width of 40 mm on the floors each formed of a punching metal plate.

[Measurement]

A wind speed was measured at a position 200 mm below the ceiling at the substantially central part of the first chamber by using an AM-09S type anemometer manufactured by Rion. A differential pressure was measured at a position which is approximately 600 mm below the ceiling and approximately 300 inward from the central part of the wall in the depth direction. In regard to foreign particles, air was sucked for one minute at the rate of 28.3 liter/min. (=1 Cubic Feet/min) by using a particle counter which is a laser dust monitor TS3700 manufactured by Hitachi Hi-Tech Electronics Engineering Co., Ltd. in order to obtain data of particles whose diameter is not less than 0.1 μm, measurement was formed for three times, and obtained data was averaged. In case of performing measurement while transferring a wafer by the conveying robot 10, a position which has a height of approximately 450 mm under the ceiling and is close to the center as much as possible without touching the arm 17 was selected as a sampling point. Moreover, in regard to sampling under the wafer, the wafer of 300 mm is stopped while being mounted on fingers at the end part of the arm 17 of the conveying robot 10 in the first chamber, and sampling was conducted directly below the wafer.

Embodiment 1

A punching plate (a perforated plate) in which a hole of 4 mm φ is opened at each apex of a regular triangle having each side of 8 mm was used, and its degree of opening was 20% when all opening parts, i.e., the gap having a width of 5 mm at the body rim of the conveying robot 10, the gap having a width of 6 mm around the door 21 and the elevating passage part of the door 21 were added up. The conveying robot 10, the power supply device 18, the control device 12 and others were set on the bottom part frame 2b, but the second floor 13 formed of a punching plate was not set in particular, and the degree of opening of the bottom part frame 2b reached 53%.

Clean air was sampled immediately above the wafer and immediately below the wafer stopped in a state where the wafer is mounted on the fingers of the conveying robot 10 while changing a blowing speed from the fan/filter unit 3 from 0.05 m/second to 0.65 m/second and changing a position of the wafer between the two FOUPs by operating the conveying robot 10, the number of foreign particles whose size is not less than 0.1 μm was measured, and a result was written in Table 1.

A differential pressure between the inside and the outside of the first chamber and a differential pressure between the inside and the outside of the second chamber were measured every time the wind speed was changed, and measured values were likewise written in Table 1. The number of times of ventilation was calculated by dividing a blowing quantity by a capacity of the first chamber.

Based on the result written in Table 1, the number of foreign particles is 0 above the wafer in case of 0.1 m/second (the number of times of ventilation is 6.4/minute) or above, and there is no problem. On the other hand, there is no problem below the wafer in case of 0.3 m/second (the number of times of ventilation is 19.1/minute), but the number of foreign particles is 0.3 in case of 0.1 m/second, 0.5 m/second and 0.6 m/second (the number of times of ventilation is 38.3/minute), and hence the class 1 is satisfied in this range.

Embodiment 2

This embodiment has the same structure as Embodiment 1 except that the degree of opening of the bottom part frame 2b is set to 25% by laying a punching plate as the second floor 13 at a part of the bottom part frame 2b, and results are all shown in Table 1. There is no problem except that 0.3 foreign particles are observed immediately below the wafer at a wind speed of 0.65 m/second. Although ventilation is not sufficient when the number of times of ventilation is 4.8 or below/minute, the class 1 is maintained with the number of times of ventilation up to 41.5/minute, and it was found that the effect of the second floor is demonstrated.

Embodiment 3

This embodiment has the same structure as Embodiment 2 except that the degree of opening of the first floor is reduced to 5%, and results are all shown in Table 1. There is no problem except that 0.3 foreign particle is observed immediately below the wafer at a wind speed of 0.6 m/second and 2.3 foreign particles are observed immediately below the wafer at a wind speed of 0.65 m/second (the number of times of ventilation is 41.5). That is, the class 1 is satisfied in a range of 0.1 m/second to 0.6 m/second.

Embodiment 4

This embodiment is has the same structure as Embodiment 1 except that the degree of opening of the bottom part frame 2b is set to 12% by laying a punching plate as the second floor 13 at a part of the bottom part frame 2b, and results are all shown in Table 1. The class 1 is satisfied in a range of 0.1 m/second to 0.65 m/second and a range of 6.4/minute as the number of times of ventilation to 41.5/minute as the number of times of ventilation, and a higher number of times of ventilation suggests excellence.

Embodiment 5

In Embodiment 4, one load port having a width of 470 mm and a height of 1577 mm was removed, and an opening part having an opening degree of 12.7% was provided on the wall of the casing 2a on the load port side over the first chamber and the second chamber. The opening degree of this opening part was 13% with respect to the part of the wall facing the first chamber. Data of the number of foreign particles and differential pressures is shown in Table 1. As a result, it was found that, when a differential pressure of the first chamber is maintained at 0.1 Pa or above in a range of 12.8 to 41.5/minute as the number of times of ventilation, the number of foreign particles below the wafer is less than 1 even if a differential pressure of the second chamber is lower than 0.1 Pa, thereby achieving the class 1. Therefore, it was revealed that, even if the load port 20 in the clean transfer device according to this embodiment fails to properly operate, the failure can be remedied by performing a replacing operation for the load port 20 without stopping the fan/filter unit 3, without causing contamination at all and without stopping the operation of the clean transfer device, or with a halt in a short time.

TABLE 1

| | (Degree of opening) | | | | | | | | | Remarks |
|---|---|---|---|---|---|---|---|---|---|---|
| Embodiment 1 | | FFU wind speed m/second | 0.05 | 0.075 | 0.1 | 0.3 | 0.5 | 0.6 | 0.65 | Arm is |
| | First floor/20% | Number of times of ventilation/minute | 3.2 | 4.8 | 6.4 | 19.1 | 31.9 | 38.3 | 41.5 | stopped |
| | Casing bottom | Number of particles/CF, above wafer | 640 | 370 | 0 | 0 | 0 | 0 | 0 | with wafer |
| | part/53% | Number of particles/CF, below wafer | 3,200 | 1,500 | 0.3 | 0.0 | 0.3 | 0.3 | 1.3 | mounted |
| | | Differential pressure (first chamber) | 0.06 | 0.15 | 0.34 | 2.7 | 8.2 | 12.2 | 16 | thereon |
| | | Differential pressure (second chamber) | 0 | 0.05 | 0.2 | 1.16 | 2.9 | 3.5 | 4.1 | |
| Embodiment 2 | (Degree of opening) | FFU wind speed m/second | 0.05 | 0.075 | 0.1 | 0.25 | 0.5 | 0.6 | 0.65 | Arm is |
| | First floor/20% | Number of times of ventilation/minute | 3.2 | 4.8 | 6.4 | 16 | 31.9 | 38.3 | 41.5 | stopped |
| | Casing bottom | Number of particles/CF, above wafer | 1,870 | 1,660 | 0 | 0 | 0 | 0 | 0 | with wafer |
| | part/25% | Number of particles/CF, below wafer | 4,420 | 1,140 | 0 | 0 | 0 | 0 | 0.3 | mounted |
| | | Differential pressure (first chamber) | 0 | 0.06 | 0.29 | 1.8 | 9.2 | 11.6 | 12.9 | thereon |
| | | Differential pressure (second chamber) | 0 | 0.05 | 0.2 | 0.4 | 2.8 | 4.5 | 5.1 | |
| Embodiment 3 | (Degree of opening) | FFU wind speed m/second | 0.05 | 0.075 | 0.1 | 0.25 | 0.5 | 0.6 | 0.65 | Arm is |
| | First floor/5% | Number of times of ventilation/minute | 3.2 | 4.8 | 6.4 | 16 | 31.9 | 38.3 | 41.5 | stopped |
| | Casing bottom | Number of particles/CF, above wafer | 3,800 | 3,170 | 0 | 0 | 0 | 0 | 0 | with wafer |
| | part/25% | Number of particles/CF, below wafer | 1,170 | 4,300 | 0 | 0 | 0 | 0.3 | 2.3 | mounted |
| | | Differential pressure (first chamber) | 0 | 0.07 | 0.43 | 2.96 | 16.6 | 21.4 | 23.8 | thereon |
| | | Differential pressure (second chamber) | 0 | 0 | 0.17 | 0.6 | 2.5 | 4 | 4.4 | |
| Embodiment 4 | (Degree of opening) | FFU wind speed m/second | 0.05 | 0.075 | 0.1 | 0.3 | 0.5 | 0.6 | 0.65 | Arm is |
| | First floor/20% | Number of times of ventilation/minute | 3.2 | 4.8 | 6.4 | 19.1 | 31.9 | 38.3 | 41.5 | stopped |
| | Casing bottom | Number of particles/CF, above wafer | 3,800 | 1,500 | 0 | 0 | 0 | 0 | 0 | with wafer |
| | part/12% | Number of particles/CF, below wafer | 2,100 | 1,100 | 0 | 0 | 0 | 0 | 0 | mounted |
| | | Differential pressure (first chamber) | 0.06 | 0.21 | 0.56 | 4.4 | 14.4 | 19.5 | 25.6 | thereon |
| | | Differential pressure (second chamber) | 0 | 0.12 | 0.39 | 3.34 | 10.6 | 13.5 | 16.8 | |
| Embodiment 5 | (Degree of opening) | FFU wind speed m/second | 0.05 | 0.1 | 0.2 | 0.3 | 0.5 | 0.6 | 0.65 | Arm is |
| | First floor/20% | Number of times of ventilation/minute | 3.2 | 6.4 | 12.8 | 19.1 | 31.9 | 38.3 | 41.5 | stopped |
| | Casing bottom | Number of particles/CF, above wafer | 3,800 | 980 | 0.0 | 0.0 | 0.0 | 0.0 | 0.0 | with wafer |
| | part/53% | Number of particles/CF, below wafer | 3,100 | 1,356 | 0.7 | 0.3 | 0.0 | 0.0 | 0.7 | mounted |
| | Wall opening/12.7% | Differential pressure (first chamber) | 0 | 0.02 | 0.12 | 0.21 | 0.4 | 0.5 | 0.6 | thereon |
| | (First chamber wall opening/13%) | Differential pressure (second chamber) | 0 | 0 | 0 | 0.02 | 0.03 | 0.04 | 0.05 | |

INDUSTRIAL APPLICABILITY

Based on the present invention, it was revealed that the class 1 can be maintained with respect to foreign particles of at least 0.1 μm in a range of 5 to 38/minute as the number of times of ventilation by providing the first floor through which air passes immediately below the arm of the conveying robot at the middle height part of the clean transfer device even if the second floor formed of a punching plate or the like which controls circulation of air is not provided to the casing bottom part in particular. This is 10-fold or more of the cleanliness of the conventional clean booth. Here, when the punching plate is used as the second floor even at a part of the casing bottom part, the number of foreign particle can be zero even on the rear side of the wafer where an eddy current of air is generated. Further, when degrees of opening of the first floor and the casing bottom part satisfy predetermined conditions, all data become zero in a range of 5 to 42/minute or above as the number of times of ventilation at a wind speed of 0.1 to 0.65 m/second or above, and the class 0 can be realized with respect to foreign particles of 0.1 μm, thereby enabling production of a semiconductor having a wire width of 0.1 μm. Furthermore, when a degree of opening of the wall and a differential pressure of the first chamber with respect to the outside satisfy predetermined conditions, the load port replacing operation can be effected without contaminating the wafer at all.

The invention claimed is:

1. A semiconductor wafer clean transfer device which automatically transfers a sheet-like electronic component accommodated in a cassette in clean air, comprising:
   a casing within which the cassette is opened;
   a fan/filter unit provided on a ceiling of the casing that blows clean air into the casing;
   a conveying robot provided in the casing that automatically transfers the semiconductor wafer between predetermined positions;
   a filter provided in the fan/filter unit that removes 99.999% or above of particulates of 0.1 μm or above; and
   a first floor provided in the casing and horizontally arranged on a lower side of an arm of the conveying robot at a middle height part of the conveying robot and through which air can pass between an upper side of the first floor and a lower side of the first floor,
   wherein the casing defines a first chamber between the first floor and the fan/filter unit, and a second chamber between the first floor and a bottom part of the casing through which air can pass between the second chamber and an outside of the bottom part of the casing, and
   the conveying robot comprises:
      a dust generation preventing seal structure provided to an articulated part of the arm; and
      a body which supports the arm and which has a vent hole arranged on a lower side of the first floor;
   a body cover disposed on a side surface of the body; and
   a base cover disposed at the base of the body;
   wherein a gap is formed on an inner side of a lower portion of the body cover between the body cover and the base cover so that air is upwardly taken in and from which air in the body is downwardly discharged to the second chamber upon a descending operation of the body.

2. The semiconductor wafer clean transfer device according to claim 1, further comprising:
   a door provided on a wall of the first chamber that moves up and down; and
   a door passage for the door, provided on the second chamber side and covered with a partition,
   wherein a part of clean air which flows into the second chamber from the first chamber is directly discharged to the casing bottom part through the door passage.

3. The semiconductor wafer clean transfer device according to claim 1, wherein a gap is provided between a door frame part provided on the wall of the first chamber and the door set so as to be adjacent thereto, and/or between the door frame part and the cassette, and between the first floor and a body of the conveying robot, and
   a width of the gap is not less than 1 mm and not more than 30 mm.

4. The semiconductor wafer clean transfer device according to claim 1, further comprising a second floor provided in the casing and horizontally arranged in the vicinity of a base of the conveying robot,
   wherein the second floor changes a degree of opening of the casing bottom part with respect to the outside, through which air can pass between an upper side and a lower side of the second floor, and the degree of opening of the casing bottom is larger than that of the first floor.

5. The semiconductor wafer clean transfer device according to claim 4, wherein an open space in the first floor is not less than 5% and not more than 50% of the total area of the first floor, and an open space in the casing bottom part is not less than 5% and not more than 70% of the total area of the casing bottom.

6. The semiconductor wafer clean transfer device according to claim 5, wherein an internal pressure of the first chamber is higher than an internal pressure of the second chamber, and
   an internal pressure of the second chamber is not less than 0.1 Pa as a gauge pressure higher than a gauge pressure of an outside of the casing.

7. The semiconductor wafer clean transfer device according to claim 1, wherein the number of times of ventilation of the first chamber is not less than 5 per minute and not more than 45 per minute.

8. The semiconductor wafer clean transfer device according to claim 1, wherein a blowing speed of the clean air into the first chamber from the fan/filter unit is not less than 0.1 m/second to not more than 0.65 m/second.

9. The semiconductor wafer clean transfer device according to claim 1, wherein one wall of the casing has an opening part which opens to at least one of the first chamber and the second chamber,
   a degree of opening of the opening part with respect to the one wall is not more than 20%,
   an internal pressure of the first chamber is not less than 0.1 Pa as a gauge pressure higher than a gauge pressure of an outside of the casing, and the number of times of ventilation of the first chamber is not less than 10 per minute and not more than 45 per minute.

10. A semiconductor wafer manufacturing system comprising the semiconductor wafer clean transfer device according to claim 1.

11. The semiconductor wafer clean transfer device according to claim 1, wherein the vent hole comprises a downward gap between a body cover and a base cover of the conveying robot.

* * * * *